United States Patent [19]

Adan et al.

[11] Patent Number: 5,057,898
[45] Date of Patent: Oct. 15, 1991

[54] DOUBLE-GATED SEMICONDUCTOR MEMORY DEVICE

[75] Inventors: Alberto O. Adan, Tenri; Koji Fujimoto, Sakurai; Jun Kudo, Nara, all of Japan

[73] Assignee: Sharp Kabushiki Kaisha, Japan

[21] Appl. No.: 616,242

[22] Filed: Nov. 20, 1990

[30] Foreign Application Priority Data

Nov. 24, 1989 [JP] Japan .................... 1-306214

[51] Int. Cl.$^5$ .................. H01L 29/04; H01L 27/02; H01L 27/01; G11C 11/00
[52] U.S. Cl. .......................... 357/59; 357/42; 357/23.7; 365/154
[58] Field of Search ............. 357/59 E, 42, 23.7; 365/154

[56] References Cited

U.S. PATENT DOCUMENTS

| | | | |
|---|---|---|---|
| 4,653,025 | 3/1987 | Minato et al. | 357/23.7 |
| 4,656,731 | 4/1987 | Lam et al. | 357/42 |
| 4,768,076 | 8/1988 | Aoki et al. | 357/42 |
| 4,894,801 | 1/1990 | Saito et al. | 365/154 |

FOREIGN PATENT DOCUMENTS 63-53965  9/1988  Japan .
63-104374 9/1988  Japan .

OTHER PUBLICATIONS

Chen et al., "Stacked CMOS SCRAM Cell", *IEEE Electron Device Letters*, vol. EDL-4 (1983) Aug., No. 8, New York, pp. 272-274.

Kawamura et al., "Three-Dimensional CMOS IC's Fabricated by using Beam Recrystallization", *IEEE Electron Device Letters*, vol. EDL-4, No. 10, Oct. 1983, New York, pp. 366-368.

IEDM 88, CH2528-8/88, 1988, IEEE, pp. 48-51.

Nikkei Microdevices No. 9, 1988, pp. 123-128.

IEEE Electron Device Letters, vol. 9, No. 1, Jan. 1988, pp. 48-51.

*Primary Examiner*—Andrew J. James
*Assistant Examiner*—Robert P. Limanek
*Attorney, Agent, or Firm*—Nixon & Vanderhye

[57] ABSTRACT

A double-gated MOS type semiconductor memory device having a pair of inverters each of which comprises a bulk MOS transistor formed in a semiconductor substrate and having a first gate electrode on the substrate, and a complementary type MOS transistor stacked over and connected with the bulk MOS transistor, the complementary tyupe MOS transistor being composed of a first insulating film, a semiconductor active layer, a second insulating film and a second gate electrode, laminated upwardly in this order on the first gate electrode, and a process for preparing the double-gated MOS type semiconductor memory device.

9 Claims, 8 Drawing Sheets

DOUBLE-GATED SEMICONDUCTOR MEMORY DEVICE

BACKGROUND OF THE INVENTION

1. Field of the Invention

This invention relates to a semiconductor memory device and a preparation of the same, and more particularly to an improvement of a Static Random Access Memory cell (called hereunder a SRAM cell).

2. Description of the Related Art

Figure 10A:
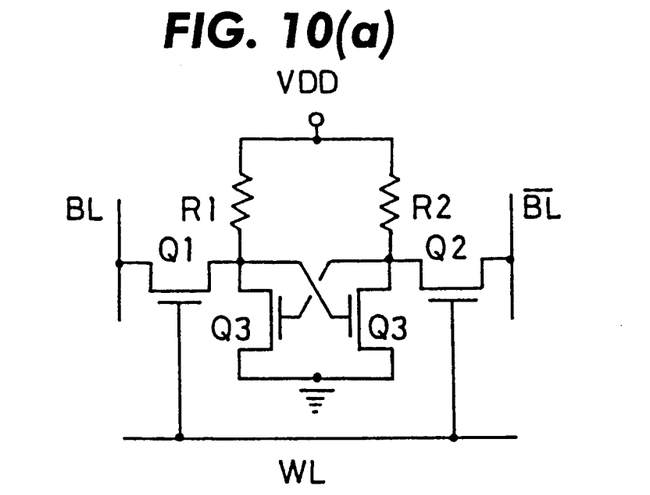
Figure 10B:
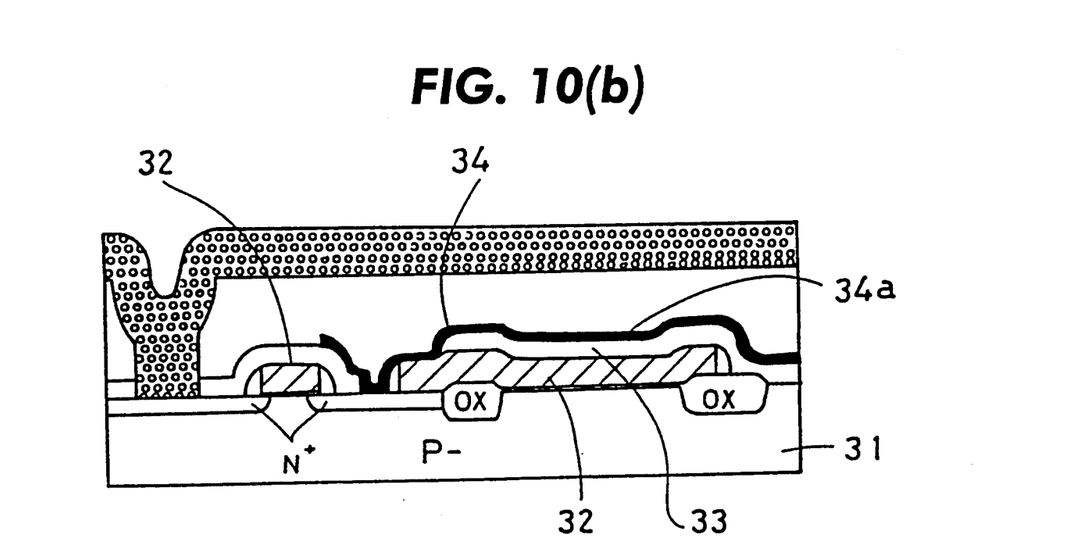

Recently, a SRAM cell with a high load resistor is widely used, which comprises, as shown in FIG. 10(a), four transistors (Q1 to Q4) and two high load resistors (R1 and R2), wherein access transistors Q1 and Q2 are each connected with respective bit lines (BL and $\overline{BL}$) at their nodes of equivalent storage capacity. The equivalent storage capacity is provided by a flip flop comprising two inverters which are connected with each other and each includes specific transistors Q3 and Q4 and load resistors R1 and R2, respectively. As shown in FIG. 10(b), transistor 32 (Q1, Q2, Q3, Q4) is a bulk device formed in a semiconductor substrate 31. For a reduced area and high density, load resistor 34a (R1, R2) is defined in a polysilicon layer 34 which is deposited on the bulk device, having a dielectric 33 therebetween.

In recent years, a cell structure using thin film MOS transistor in place of the resistor has been proposed and is so constructed that a lower transistor layer and a polysilicon active layer 41 commonly have the same gate electrode 40 placed therebetween.

Problems involved in the conventional SRAM cells including the above two kinds of cell structure will be detailed hereunder (1) For applications requiring Static Access Memories to operate with batteries, it is essential to have a very low standby power dissipation and a 1μA total standby current should be specified. For operation of a SRAM cell of a polysilicon load resistor type with a large bit density more than 1 Megabit, it, therefore, is essential to have a very high load resistance in an order of $10^{13}$ ohm, assuming that source voltage is 3 to 5V. It is technically hard to obtain such value of resistance with high accuracy as the device is microminiaturized. Also, in use of the above high load resistor, current to be supplied therein is very low as about $3 \times 10^{-13}$ A which results in limited noise margin, increase of soft error and the like as referred to hereunder. (2) In an operation state of a SRAM, a memory cell is connected with a bit line of a different potential from those at the cell node through an access transistor in a read-out cycle, thereby causing an electric charge sharing between the bit lines and the memory cell. As a result, potential of the memory cell which corresponds to a voltage close to the power supply voltage $V_{DD}$ in "1" state lowers to a value close to the voltage at the bit line since the bit line is far higher in capacity than the memory cell.

The load device for a memory cell (NOTE: Polysilicon resistor in the conventional cells) serves for supplying electric charge for restoring potential of memory cell storage node after read-out to an initial potential. The restoration time in this case is proportional to the current to be supplied by the load device and the time constant on recharge is represented by the following equation.

Figure 9A:
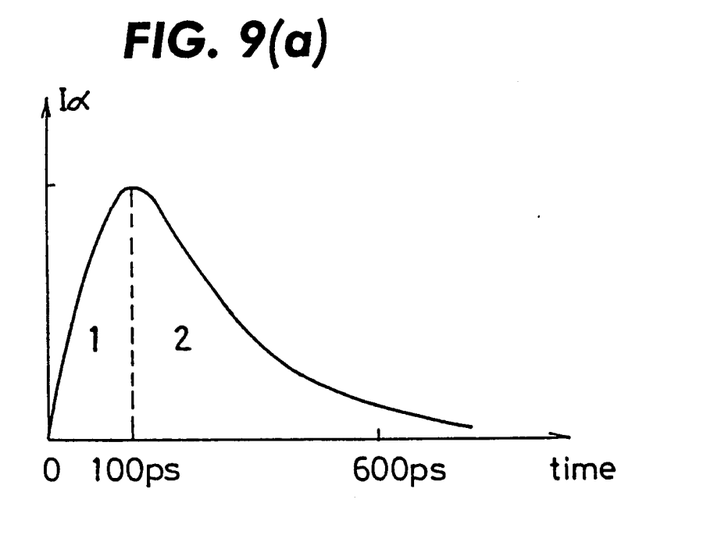
Figure 9B:
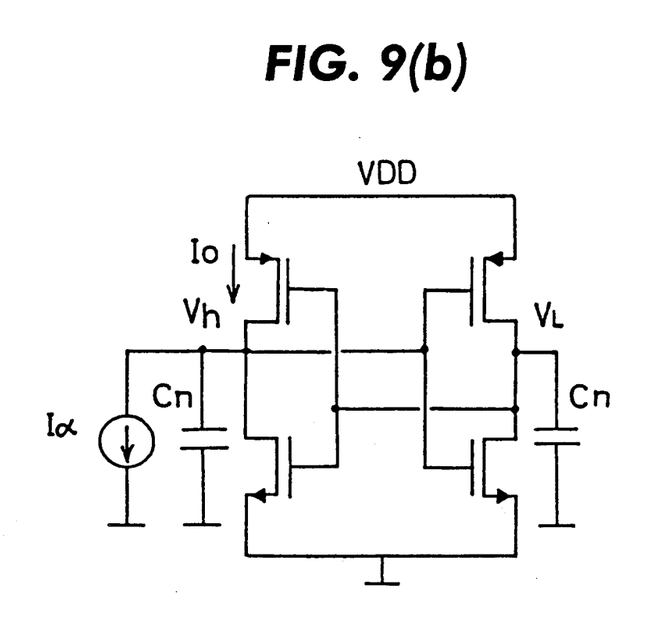

$T = C_N \times R$  $C_N$: Equivalent capacity of memory cell node (5 to 10 fF for 1 MSRAM)
  R: Resistance of high load resistor The time constant T on recharge is 0.1 sec when $R = 10^{13}$ ohm. The mean time interval to a next access of memory cell is usually less than 1 msec and the cell voltage is not sufficiently restored within that time, whereby the cell is sensitive to disturbance by noise to have decreased noise margin. (3) Next, a problem of soft error by α rays will be detailed As the memory cell is microminiaturized, its storage capacity is reduced, thereby soft error by α rays is likely to occur. Critical electric charge to induce breakage of stored data is represented by the following equation by using the simple circuit model shown in FIG. 9.

$$Q_{cri} = V_h \times C_N / (1 - I_{load}/I_{60})$$

Figure 11A:
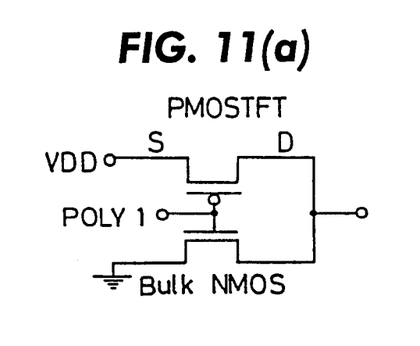
Figure 11B:
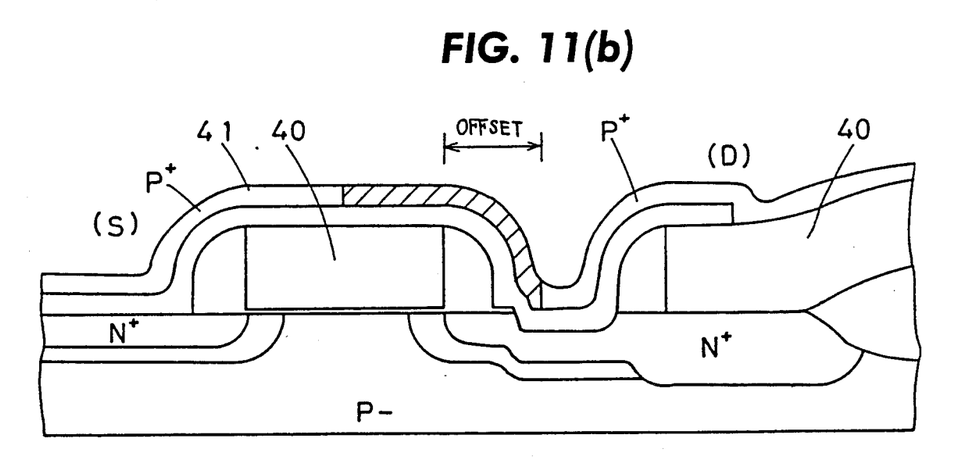
Figure 11C:
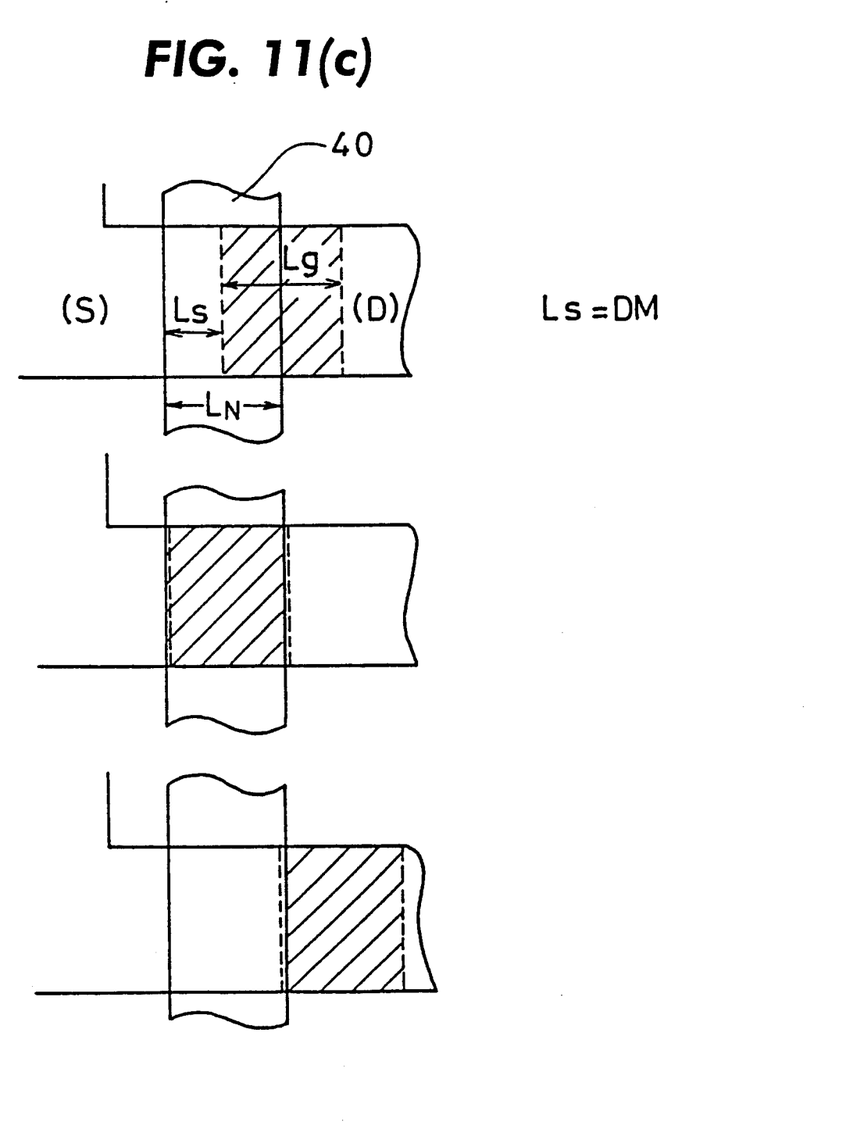

$V_h$: Voltage of a node which stores "1" upon application of α rays
$C_N$: Equivalent storage capacity of memory cell
$I_{load}$: Current to be supplied from load device
$I_α$: α rays inducing current In a SRAM cell with a high load resistor, $I_{load} \ll < I_α$, and the mean value of $V_h$ is lower than supply voltage $V_{DD}$ as referred at the item (3) and the value of $Q_{crit}$ becomes lower. As a result, soft error resistance particularly in a high speed operation of the device is deteriorated. (4) A memory cell using polysilicon MOS transistor as load devices is able to allow a higher ON current in comparison with that of the high load resistor type, thereby realizing a largely shortened recharge time and improved stability of the memory device. Hence, this technique is effective for constituting SRAM having high noise margin at a high speed operation and a very low standby power dissipation. However, in the known SRAM using polysilicon MOS transistor, the channel regions of the transistors are defined by the use of a photoresist mask, whereby it is difficult to align channel regions with a gate electrode underlying them, particularly for transistors in submicron size. In detail, in a memory cell wherein a bulk transistor and a polysilicon transistor commonly have the same gate electrode 40, when the bulk NMOS transistor is of the minimum channel length $L_n$ as shown in FIG. 11(c), the alignment registration tolerance DM is approximately $L_n/2$. Hence, the substantial channel length of the polysilicon MOS transistor will vary between 0 and $L_n$, thereby inducing non-uniformity in property of the cells. This results in great limitation for decreasing the size of cells and difficulty for producing operable memory devices.

SUMMARY OF THE INVENTION

The invention has been accomplished to overcome the above problem. An object of the invention is to provide a semiconductor memory device comprising a SRAM cell which eliminates positional variation of channel regions of polyslicon transistors each constituting an inverter; requires a smaller area for constitution to thereby be suitable for large scale integration; has a higher response speed and lower standby current dissipation; has a reduced noise influence and soft errors; and has a reduced variation in property for mass production.

According to the present invention, there is provided a semiconductor memory device which comprises a static random access memory cell comprising a flip flop circuit composed of a pair of inverters connected with each other and each having a node, and a pair of MOS access transistors each connecting the nodes of the inverters with a pair of bit lines, the pair of inverters each comprising a bulk MOS transistor formed in a semiconductor substrate and having a first gate electrode on the substrate, and a complementary type MOS transistor stacked over and connected with the bulk MOS transistor, forming the inverter load, the complementary type MOS transistor being composed of a first insulating film, a semiconductor active layer, a second insulating film, and a second gate electrode, laminated upwardly in this order on the first gate electrode of the bulk MOS transistor.

In this way, the stacked complementary type MOS transistor is arranged in such a way that it has two effective gate electrodes. The top (or upper) gate also acts as self-alignment mask for source and drain formation, and the bottom (or lower) electrode is the gate of the underlying bulk MOS transistor. In this memory device, both the gate electrodes of the complementary type MOS transistor are connected together at the same electrical potential, and surrounding the transistor channel, constituting a Double-Gated MOS transistor.

BRIEF DESCRIPTION OF THE DRAWINGS

FIGS. 1(a) to (c) are explanatory views showing a structure of a semiconductor memory device of the present invention, in which FIGS. 2a to 8a are explanatory views showing a producing process of a semiconductor memory device fabricated in an example of the present invention, FIG. 9a-9b is an explanatory view showing soft error caused by α rays, and FIGS. 10a to 11c are explanatory views each showing a conventional semiconductor memory device.

DETAILED DESCRIPTION OF THE PREFERRED EMBODIMENTS

In the present invention, the inverter comprises a bulk MOS transistor formed in a semiconductor substrate and a complementary type MOS transistor comprising a first insulating film, a semiconductor active layer, a second insulating film, and a second gate electrode layer each laminated upwardly in this order on the first gate electrode of the bulk transistor. The inverter is provided for constituting the flip flop circuit capable of constructing a SRAM cell that is suitable for large scale integration, excellent in response speed, low in standby power dissipation, and also has a reduced noise influence and soft error and a reduced variation in properties during fabrication.

In the memory device of the present invention, specific examples of the complementary type MOS transistor include a polycrystalline silicon (indicated hereinafter as polysilicon) MOS transistor which comprises a polysilicon active layer. Any other semiconductor layer may be used for the formation of the MOS transistor.

The bulk MOS transistor can be prepared by forming the first gate electrode on a semiconductor substrate and then implanting impurity into the substrate by using the gate electrode as a mask so as to provide the source and drain regions in the substrate. On the other side, the complementary type MOS transistor can be prepared, for example, by depositing the first insulating film, the polysilicon active layer, the second insulating film and the second gate electrode as being laminated in this order on the gate electrode (the first gate electrode) of the bulk MOS transistor.

The complementary type MOS transistor, typically polysilicon MOS transistor, other than the contact portion thereof, is insulated from the bulk MOS transistor through the first insulating film, and has the source, drain and channel regions in the polysilicon active layer and the second gate electrode. The first gate electrode of the bulk MOS transistor which is positioned below the polysilicon MOS transistor is commonly used for controlling the polysilicon MOS transistor and the bulk MOS transistor.

The first and second gate electrodes sandwiching the semiconductor active layer, typically polysilicon active layer, may be interconnected to have the same electrical potential for controlling induced charge and potential distribution in the polysilicon active layer. This structure enables the polysilicon transistor to be driven at a higher current and reduces the short channel effect, thereby realizing improvement in resistance to noise and allowing a lower standby current for the present semiconductor memory device of a larger bit density. Also, the above structure increases equivalent storage capacity $C_N$ of memory cell, which effect together with an increased $I_{load}$ improves the resistance of the device to soft error possibly caused by α rays.

The first or second gate electrode may be prepared by forming a layer usually with thickness 1000 to 5000 Å made of polysilicon doped, for example, with N-type or P-type impurity, a metal of high melting point such as W and Ti, or a silicide such as $TiSi_2$ or $MoSi_2$. A composite layer made of a plurality of the above materials may be used as the gate electrode. The width of the gate electrodes (an extent corresponding to gate length) is usually 0.5 to 2.0 μm for the first gate electrode and 0.5 to 3.0 μm for the second gate electrode. For a device of lower standby power dissipation, the second gate electrode is set in width to be larger than the first gate electrode to have an offset structure therewith, whereby allowing leakage current to be reduced. A high speed operable device should not be limited to this structure.

The first or second insulating film may be prepared by forming, for example, $SiO_2$ film, SiN film or a composite film thereof usually of thickness 100–1000 Å, for example, in accordance with thermal oxidation process, CVD process or the like. The base layer of the semiconductor active layer, typically polysilicon active layer, may be prepared, in accordance for example with LPCVD process, APCVD process or the like, by depositing polysilicon or amorphous silicon usually 100 to 1000 Å in thickness. A heat treatment for polycrystalization is conducted in the case of amorphous silicon.

The semiconductor active layer, typically of polysilicon, is provided therein with the source and drain regions. These regions can be formed in such a self-aligned manner by injecting impurity, for example, in accordance with ion implantation process using as a mask the second gate electrode formed on the active layer through the second insulating film. Such a manner using the second gate electrode as a self-alignment mask allows the memory device to have a high controllability for desired microminiaturization.

Next, the present invention will be detailed with referring to the accompanied drawings.

Figure 1A:
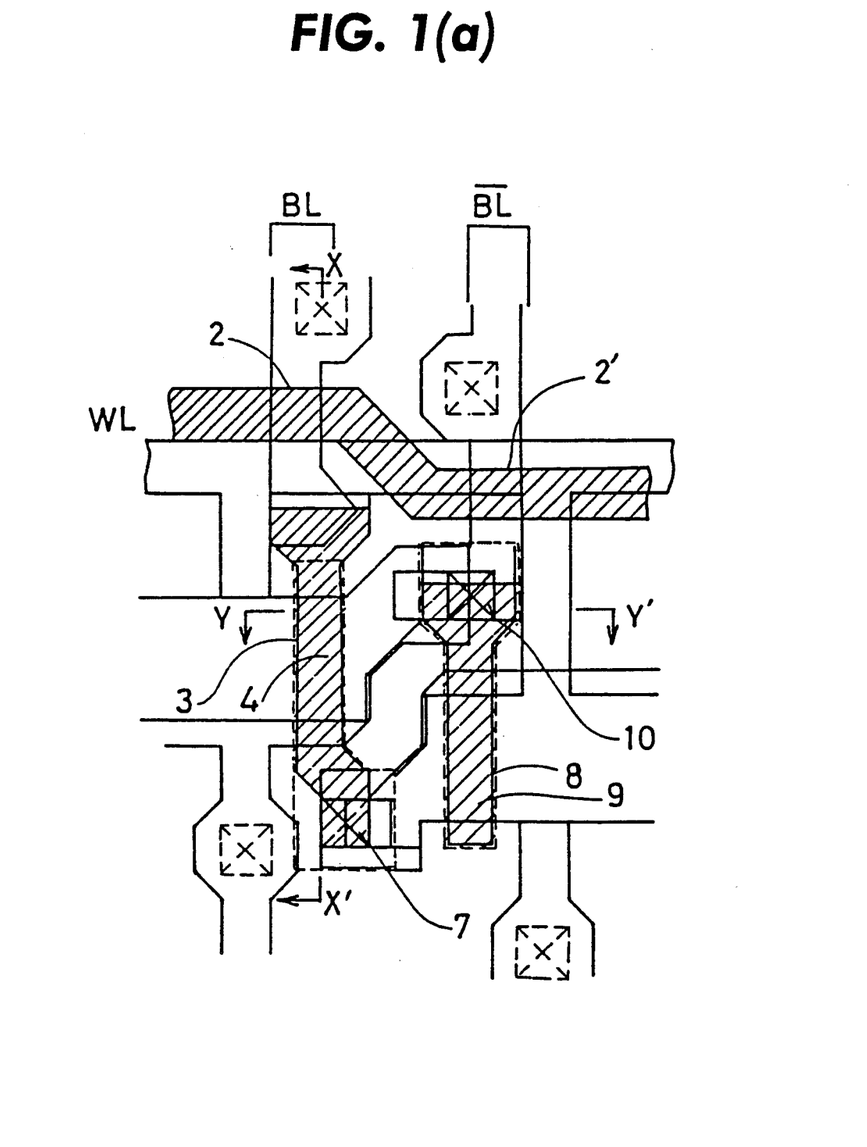
FIG. 1(a) is a plan view.
Figure 1B:
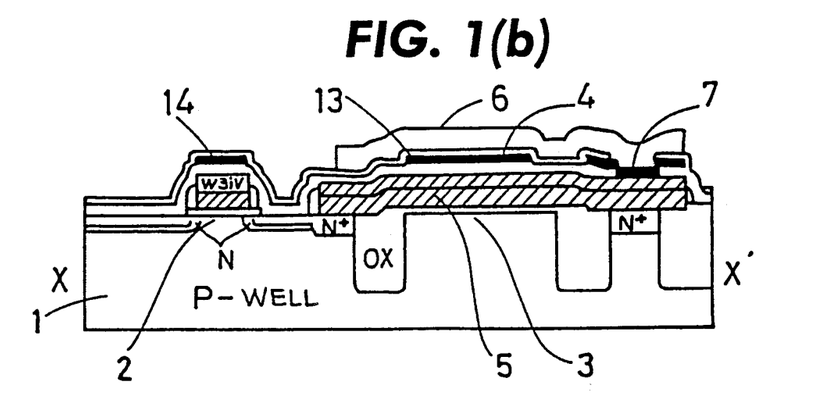
FIG. 1(b) is a sectional view in X—X line.
Figure 1C:
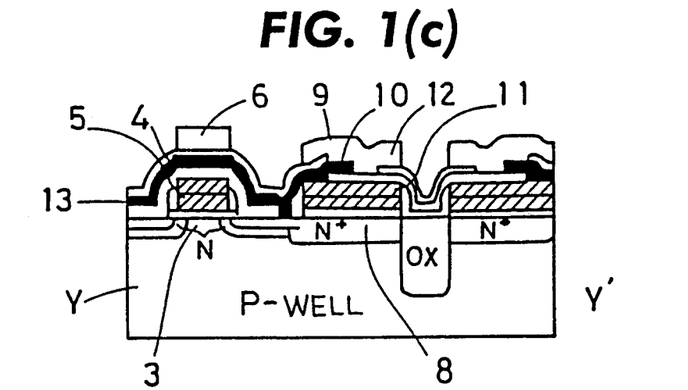
FIG. 1(c) is another view in Y—Y line.

In the SRAM cell of the present invention, the bulk MOS transistor 3 and polysilicon MOS transistor 4 or the bulk transistor 8 and polysilicon MOS transistor 9 constituting the respective inverters in the flip flop circuit are formed in and on a semiconductor substrate 1 as stacked with each other as shown in FIG. 1(a),(b) and (c). The first gate electrode 5 (or 11) of the bulk MOS transistor 3 (or 8) also acts as a lower gate for the polysilicon MOS transistor 4 (or 9) and is connected at a contact portion 7 with the second gate electrode 6 above the polysilicon MOS transistor 4 through the drain region in the polysilicon MOS transistor 9 which constitutes the other inverter. Similarly, the gate electrodes 11 and 12 beneath the polysilicon MOS transistor 9 are connected at a contact portion 10 through the drain region in the polysilicon MOS transistor 4. Therefore, the first gate electrode 3 (or 11) constitutes a pair of gate electrodes with the second gate electrode 6 (or 12) as having the same potential, thereby improving property of polysilicon MOS transistor 4 (or 9) comprising the above gate electrodes and a polysilicon active layer sandwiched therebetween.

Figure 1D:
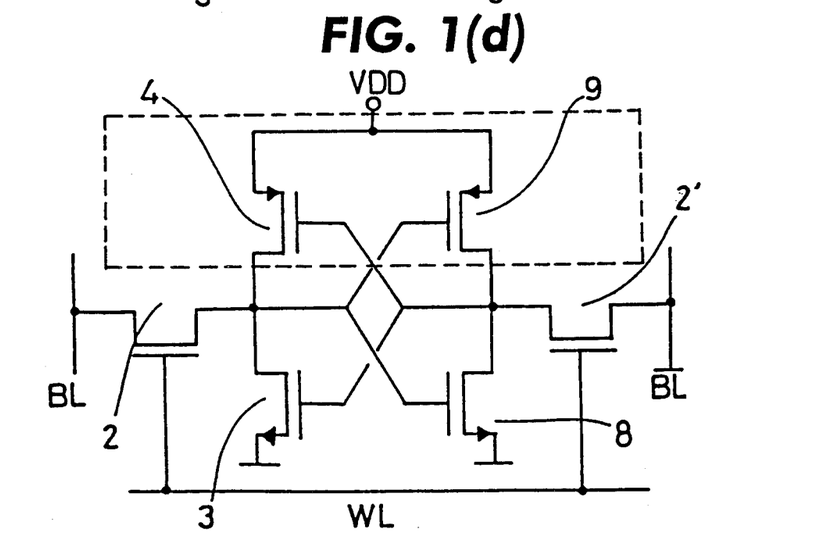
FIG. 1(d) is a view of an equivalent circuit.

Further, an access transistor 2 is formed in the semiconductor substrate 1 and connected at a contact portion with a bit line (BL)14 which is made of a metallic interconnection layer. There is also formed a metal wiring layer for formation of a grounding line connecting bulk MOS transistor 3 (or 8) with the source region and the like. Furthermore, the access transistors 2, 2' are provided in the semiconductor substrate, which are connected at their source regions with bit lines BL and BL respectively, and at their drain regions with the drain regions of bulk MOS transistors 3 and 8 for pull-down of the memory cell, thereby forming SRAM cell as shown in FIG. 1(d) to constitute a semiconductor memory device of the present invention.

In the semiconductor memory device of the present invention, the second gate electrode formed on the first gate electrode of the bulk MOS transistor comprising the first insulating film, the semiconductor active layer (typically, polysilicon active layer), and the second insulating layer functions together with the first gate electrode as a pair of gate electrodes for the complementary MOS transistor to control an induced charge and potential distribution of the source, drain and channel regions formed in a self-alignment manner by using the second gate electrode as it is as a mask.

EXAMPLES

Figure 2A:
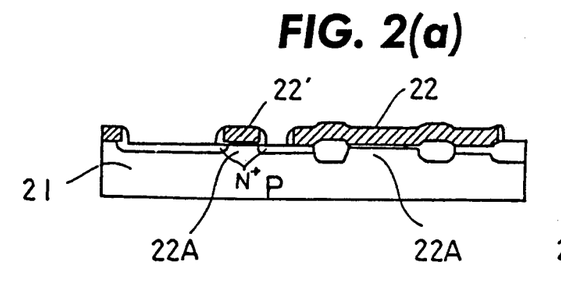
Figure 2B:
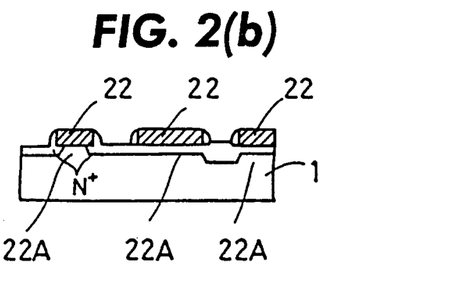

Examples of MOS process realizing the semiconductor memory device of the present invention will be detailed with referring to the accompanied drawings First, as shown in FIG. 2, a gate electrode 22 (polysilicon) is formed on a silicon substrate 21 in accordance with a conventional MOS process, and an impurity is implanted in the silicon substrate to produce Bulk Nch.polysilicon gate transistor 22A.

Figure 3A:
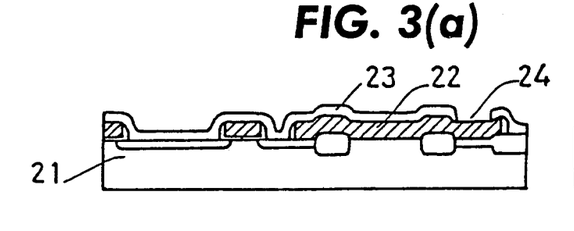
Figure 3B:
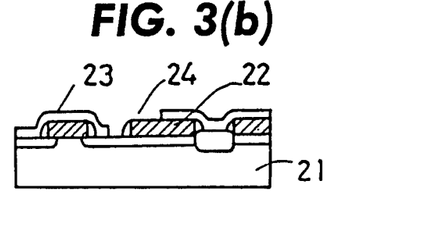

Next, as seen in FIG. 3, a CVD oxide film 23 (thickness 500 Å) is formed and thereafter a contact hole 24 is made by photoetching techniques. This CVD oxide forms the polisilicon MOS transistor first (or lower) gate dielectric.

Figure 4A:
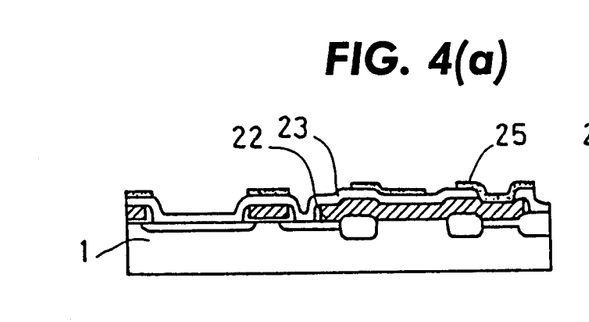
Figure 4B:
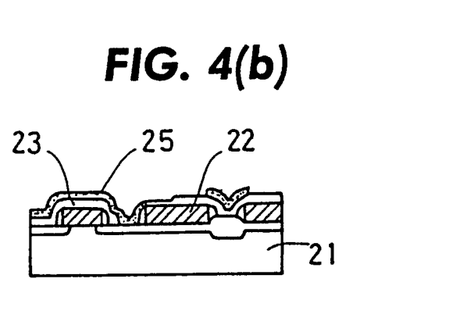

After a polysilicon layer (thickness 1000 Å) is formed over the CVD oxide film 23 by LPCVD process, an active layer 25 of the polysilicon MOS transistor is formed as shown in FIG. 4 by photoetching techniques.

Figure 5A:
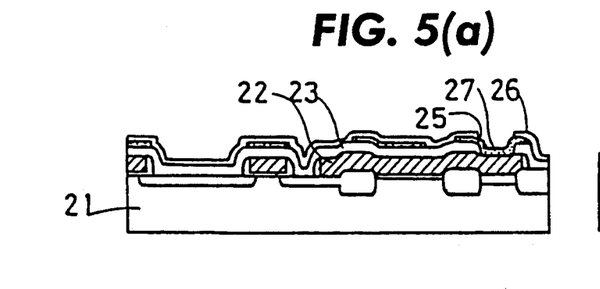
Figure 5B:
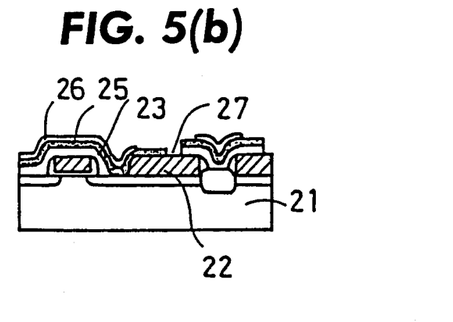

Next, as shown in FIG. 5, a CVD oxide film (thickness 300 Å) serving as a second (or upper) gate insulating film 26 of polysilicon MOS transistor is formed and a contact hole 27 is made by photoetching techniques.

Figure 6A:
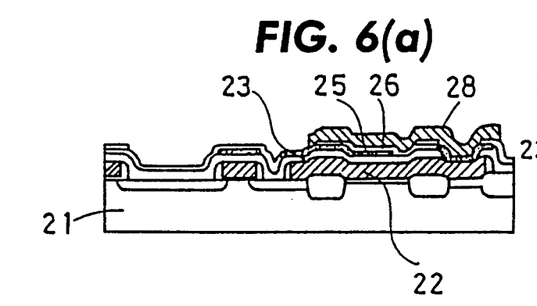
Figure 6B:
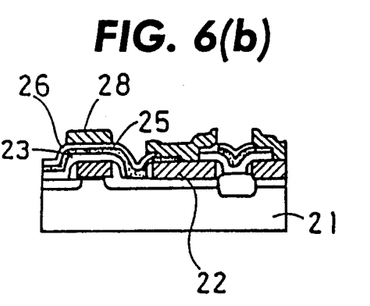

Then, a polysilicon layer (thickness 2500 Å) is formed which is patterned by photoetching to provide the second (or upper) gate electrode 28 of polysilicon MOS transistor (PMOSTFT GATE).

Figure 7A:
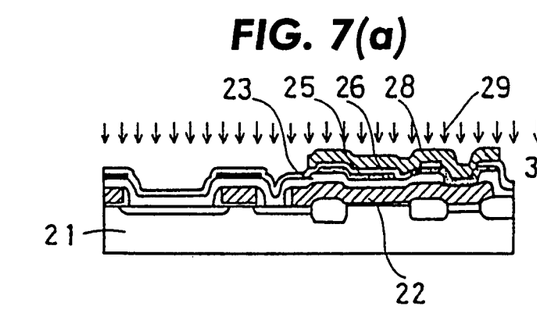
Figure 7B:
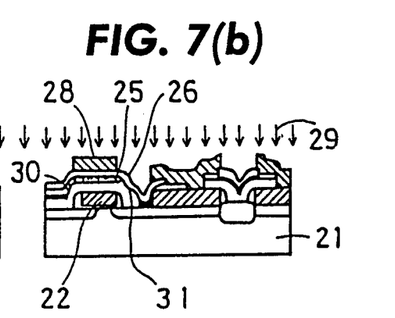

Further, as shown in FIG. 7, ion implantation of Boron 29 is performed to form a self-aligned source region 30 and drain region 31 in the polysilicon MOS transistor.

Figures 8A, 8B:
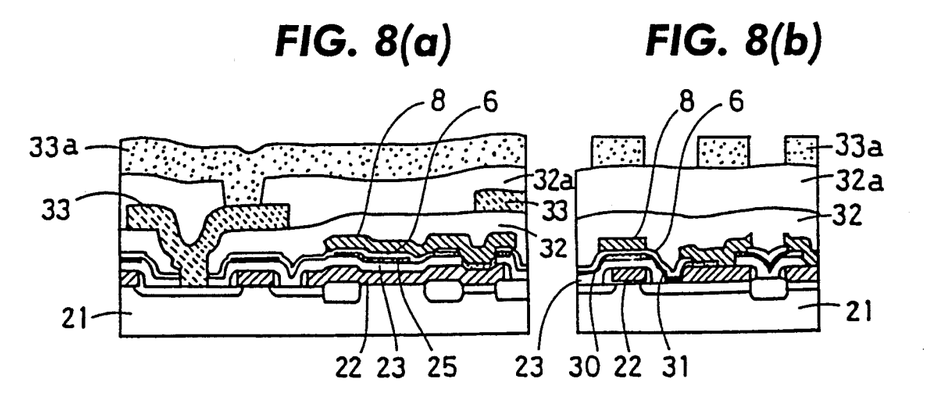

Finally, as shown in FIG. 8, the formation of insulating layers 32, 32a and a metal wiring layer and photoetching are repeated to provide two metal wiring layers 33, 33a to complete the device constitution. In this example, CVD-SiO$_2$ is used for the insulating layers. Thereafter, an annealing treatment is performed in a hydrogen plasma atmosphere at 200° to 400° C. for improvement of properties of the polysilicon MOS transistor.

Regarding the transistors constituting a memory cell, it is preferable to use Pch. (P-channel) semiconductor having less leakage current for the polysilicon MOS transistor, whereby it is preferable to use Nch.(N-channel) semiconductor for the bulk MOS transistor. However, the present invention should not be limited to this combination.

According to the present invention, there is provided a semiconductor memory device which eliminates positional variation of channel regions of polysilicon or like MOS transistors each constituting an inverter; requires a smaller area for constitution to thereby be suitable for large scale integration; has a higher response speed, and a lower standby current dissipation; has a reduced noise influence and soft errors.

Furthermore, the stacked Double-Gated MOS transsisitors of the present invention as discribed above are simultaneously controlled by two gate electrodes, unlike the conventional devices. By connecting both gate electrodes together, at the same electrical potential, the induced channel charge in the complementary type MOS transistor (typically, polysilicon MOS transistor) is more effectively modulated, increasing driving current, and reducing short-channel degradation.

Therefore, the present invention is of great worth in the art of semiconductor.

What we claim is:

1. A semiconductor memory device which comprises a static random access memory cell comprising a flip flop circuit composed of a pair of inverters connected with each other and each having a node, and a pair of MOS access transistors each connecting the nodes of the inverters with a pair of bit lines, the pair of inverters each comprising a bulk MOS transistor formed in a semiconductor substrate and having a first gate electrode on the substrate, and a complementary type MOS transistor stacked over and connected with the bulk MOS transistor, and forming the inverter load, the complementary type MOS transistor being composed of a first insulating film, a semiconductor active layer, a second insulating film and a second gate electrode, laminated upwardly in this order on the first gate electrode of the bulk MOS transistor.

2. The memory device of claim 1 in which the complementary type MOS transistor is a polysilicon MOS transistor having a polysilicon active layer as the semiconductor active layer.

3. The memory device of claim 1 in which the first and second gate electrodes of the complementary type MOS transistor are each a layer made of N-type or P-type polysilicon, a metal of high melting point or a silicide, or a composite layer composed of two or more layers of these materials.

4. The memory device of claim 1 in which the first and second gate electrodes each has a thickness of 1000 to 5000 Å.

5. The memory device of claim 1 in which the first and second gate electrodes each has a gate length of 0.5 to 3.0 μm.

6. The memory device of claim 1 in which the first and second insulating films are each $SiO_2$ film, SiN film or a composite film thereof.

7. The memory device of claim 1 in which the first and second insulating films each has a thickness of 100 to 1000 Å.

8. The memory device of claim 1 in which the semiconductor active layer has a thickness of 100 to 1000 Å.

9. The memory device of claim 1 in which the semiconductor active layer has self-aligned source and drain regions.

* * * * *